(12) United States Patent  
Saito

(10) Patent No.: US 7,839,180 B2  
(45) Date of Patent: Nov. 23, 2010

(54) NOISE FILTER CIRCUIT, NOISE FILTERING METHOD, THERMAL HEAD DRIVER, THERMAL HEAD, ELECTRONIC INSTRUMENT, AND PRINTING SYSTEM

(75) Inventor: Tadamori Saito, Suwa-gun (JP)

(73) Assignee: Seiko Epson Corporation, Tokyo (JP)

( * ) Notice: Subject to any disclaimer, the term of this patent is extended or adjusted under 35 U.S.C. 154(b) by 2 days.

(21) Appl. No.: 12/172,690

(22) Filed: Jul. 14, 2008

(65) Prior Publication Data

US 2009/0128211 A1   May 21, 2009

(30) Foreign Application Priority Data

Nov. 15, 2007   (JP) ............................. 2007-296589

(51) Int. Cl.
*G01R 29/02*   (2006.01)
(52) U.S. Cl. ........................................ 327/34; 327/217
(58) Field of Classification Search .................. 327/217
See application file for complete search history.

(56) References Cited

U.S. PATENT DOCUMENTS

| 6,377,099 | B1* | 4/2002 | Cairns et al. ................ 327/217 |
| 7,183,826 | B2 | 2/2007 | Hashimoto |
| 2004/0095179 | A1* | 5/2004 | Eliason ........................ 327/217 |
| 2005/0068062 | A1* | 3/2005 | Yamasaki et al. ............. 326/81 |
| 2005/0127971 | A1* | 6/2005 | Hoff ............................ 327/217 |
| 2009/0167395 | A1* | 7/2009 | Bosshart ..................... 327/208 |

FOREIGN PATENT DOCUMENTS

| JP | U-48-67644 | 8/1973 |
| JP | A 50-54271 | 5/1975 |
| JP | A-59-11031 | 1/1984 |
| JP | A-60-111520 | 6/1985 |
| JP | A 03-153118 | 7/1991 |
| JP | A 04-81118 | 3/1992 |
| JP | A-7-15297 | 1/1995 |
| JP | A 07-050557 | 2/1995 |
| JP | A-11-27114 | 1/1999 |
| JP | A-11-103241 | 4/1999 |
| JP | A-11-331096 | 11/1999 |
| JP | A 2001-127593 | 5/2001 |
| JP | A 2003-163583 | 6/2003 |
| JP | A 2005-260602 | 9/2005 |

OTHER PUBLICATIONS

Office Action issued for Japanese Application No. 2007-296589 on Oct. 13, 2009.
Toshio Yuyama, "Digital IC Circuit Design," pp. 97-99, Second Edition, CQ Publishing Co., Ltd., Jan. 10, 1987.

* cited by examiner

*Primary Examiner*—Lincoln Donovan
*Assistant Examiner*—Ryan C Jager
(74) *Attorney, Agent, or Firm*—Oliff & Berridge PLC

(57) ABSTRACT

A noise filter circuit includes a latch circuit that receives an input signal. The latch circuit includes first and second logic circuits (e.g., NAND circuits). The first and second NAND circuits are configured so that the capability of a P-type transistor that receives a set signal or a reset signal is lower than the capability of an N-type transistor that receives the set signal or the reset signal and the capability of an N-type transistor connected in series with the N-type transistor that receives the set signal or the reset signal (total capability). The noise filter circuit may include a waveform adjusting circuit that receives an output signal from the latch circuit.

13 Claims, 12 Drawing Sheets

NOISE FILTER CIRCUIT, NOISE FILTERING METHOD, THERMAL HEAD DRIVER, THERMAL HEAD, ELECTRONIC INSTRUMENT, AND PRINTING SYSTEM

Japanese Patent Application No. 2007-296589 filed on Nov. 15, 2007, is hereby incorporated by reference in its entirety.

BACKGROUND OF THE INVENTION

The present invention relates to a noise filter circuit, a noise filtering method, a thermal head driver, a thermal head, an electronic instrument, a printing system, and the like.

An electronic instrument may include a noise filter circuit in order to remove noise contained in a signal (e.g., JP-A-2003-163583 (FIG. 1)).

It is generally desirable that an electronic instrument or a circuit (e.g., noise filter circuit) included in an electronic instrument have a simple structure. However, it is difficult to design a circuit having a simple structure.

SUMMARY

According to one aspect of the invention, there is provided a noise filter circuit comprising a latch circuit that receives an input signal, the latch circuit including a first logic circuit and a second logic circuit;

each of the first logic circuit and the second logic circuit including a first transistor of a first conductivity type, a first transistor of a second conductivity type, a second transistor of the first conductivity type, and a second transistor of the second conductivity type;

the first transistor of the first conductivity type and the first transistor of the second conductivity type of either of the first logic circuit and the second logic circuit receiving a set signal and outputting a first output level;

the first transistor of the first conductivity type and the first transistor of the second conductivity type of the other of the first logic circuit and the second logic circuit receiving a reset signal and outputting a second output level;

the second transistor of the first conductivity type and the second transistor of the second conductivity type of either of the first logic circuit or the second logic circuit receiving the second output level;

the second transistor of the first conductivity type and the second transistor of the second conductivity type of the other of the first logic circuit and the second logic circuit receiving the first output level;

each of the first logic circuit and the second logic circuit being configured so that:

the first transistor of either of the first conductivity type and the second conductivity type is connected in parallel to the second transistor of either of the first conductivity type and the second conductivity type;

the first transistor of the other of the first conductivity type and the second conductivity type is connected in series to the second transistor of the other of the first conductivity type and the second conductivity type; and the capability of the first transistor of either of the first conductivity type and the second conductivity type is lower than the capability of the first transistor of the other of the first conductivity type and the second conductivity type and the capability of the second transistor of the other of the first conductivity type and the second conductivity type; and the latch circuit outputting the first output level or the second output level as an output signal.

According to another aspect of the invention, there is provided a thermal head driver comprising the above noise filter circuit.

According to another aspect of the invention, there is provided a thermal head comprising the above thermal head driver.

According to another aspect of the invention, there is provided an electronic instrument comprising the above noise filter circuit.

According to another aspect of the invention, there is provided a printing system comprising a printer that includes the above noise filter circuit.

According to anther aspect of the invention, there is provided a noise filtering method comprising providing an input signal;

inverting the input signal;

inputting the input signal and a signal obtained by inverting the input signal to a latch circuit as a set signal and a reset signal;

causing the latch circuit to operate so that either of two output levels rises gently and is delayed;

causing the latch circuit to operate so that the other of the two output levels falls gently and is delayed; and outputting either of the two output levels or the other of the two output levels as an output signal.

DETAILED DESCRIPTION OF THE EMBODIMENT

Figure 1:
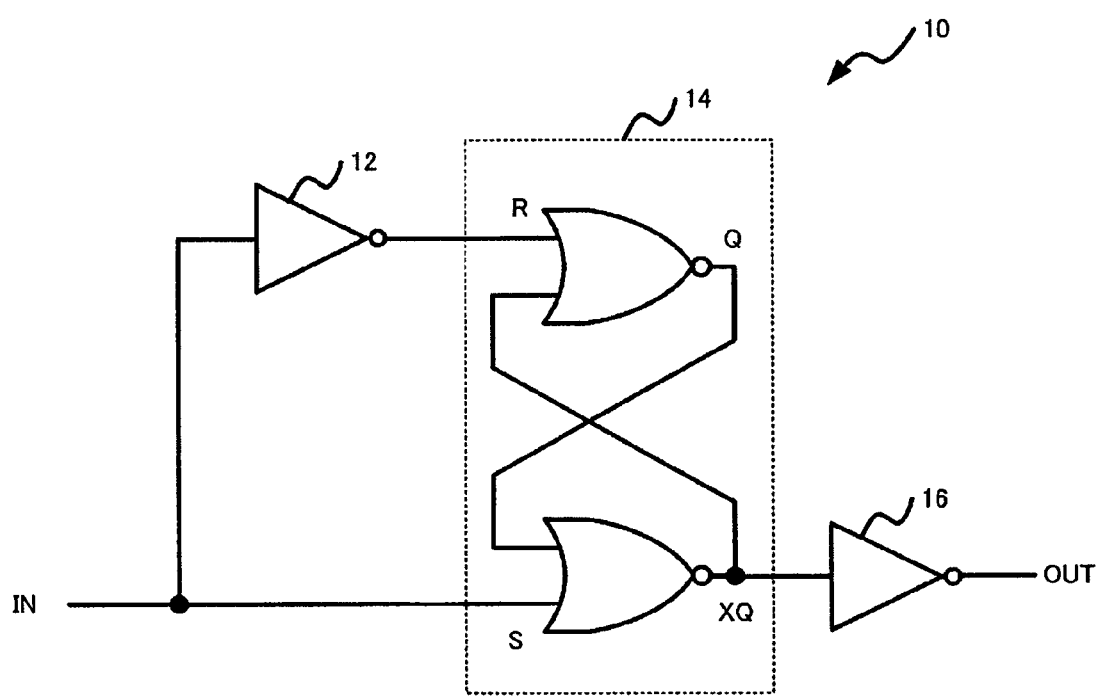
FIG. 1 is a schematic block diagram showing a noise filter circuit (first specific embodiment) according to the invention.

Several aspects of the invention may provide a noise filter circuit having a simple structure, a thermal head driver, a thermal head, an electronic instrument, and a printing system.

According to one embodiment of the invention, there is provided a noise filter circuit comprising a latch circuit that receives an input signal, the latch circuit including a first logic circuit and a second logic circuit;

each of the first logic circuit and the second logic circuit including a first transistor of a first conductivity type, a first transistor of a second conductivity type, a second transistor of the first conductivity type, and a second transistor of the second conductivity type;

the first transistor of the first conductivity type and the first transistor of the second conductivity type of either of the first logic circuit and the second logic circuit receiving a set signal and outputting a first output level;

the first transistor of the first conductivity type and the first transistor of the second conductivity type of the other of the first logic circuit and the second logic circuit receiving a reset signal and outputting a second output level;

the second transistor of the first conductivity type and the second transistor of the second conductivity type of either of the first logic circuit or the second logic circuit receiving the second output level;

the second transistor of the first conductivity type and the second transistor of the second conductivity type of the other of the first logic circuit and the second logic circuit receiving the first output level;

each of the first logic circuit and the second logic circuit being configured so that:

the first transistor of either of the first conductivity type and the second conductivity type is connected in parallel to the second transistor of either of the first conductivity type and the second conductivity type;

the first transistor of the other of the first conductivity type and the second conductivity type is connected in series to the second transistor of the other of the first conductivity type and the second conductivity type; and the capability of the first transistor of either of the first conductivity type and the second conductivity type is lower than the capability of the first transistor of the other of the first conductivity type and the second conductivity type and the capability of the second transistor of the other of the first conductivity type and the second conductivity type; and the latch circuit outputting the first output level or the second output level as an output signal.

According to this embodiment, the latch circuit can delay the set signal and the reset signal. Therefore, noise contained in the input signal can be reduced. According to this embodiment, a noise filter circuit having a simple structure can be provided.

In the noise filter circuit according to this embodiment, the first logic circuit and the second logic circuit may be a first OR circuit and a second OR circuit, respectively;

the first OR circuit may include a P-type first transistor, an N-type first transistor, a P-type second transistor, and an N-type second transistor;

the second OR circuit may include a P-type first transistor, an N-type first transistor, a P-type second transistor, and an N-type second transistor;

the first transistor of the first conductivity type and the first transistor of the second conductivity type of the first OR circuit may receive the set signal and may output the first output level;

the first transistor of the first conductivity type and the first transistor of the second conductivity type of the second OR circuit may receive the reset signal and may output the second output level;

the second transistor of the first conductivity type and the second transistor of the second conductivity type of the first OR circuit may receive the second output level;

the second transistor of the first conductivity type and the second transistor of the second conductivity type of the second OR circuit may receive the first output level;

in the first OR circuit, the N-type first transistor and the N-type second transistor may be connected in parallel, the P-type first transistor and the P-type second transistor may be connected in series, and the capability of the N-type first transistor may be lower than the capability of the P-type first transistor and the capability of the P-type second transistor; and in the second OR circuit, the N-type first transistor and the N-type second transistor may be connected in parallel, the P-type first transistor and the P-type second transistor may be connected in series, and the capability of the N-type first transistor may be lower than the capability of the P-type first transistor and the capability of the P-type second transistor.

In the noise filter circuit according to this embodiment, the first logic circuit and the second logic circuit may be a first AND circuit and a second AND circuit, respectively;

the first AND circuit may include a P-type first transistor, an N-type first transistor, a P-type second transistor, and an N-type second transistor;

the second AND circuit may include a P-type first transistor, an N-type first transistor, a P-type second transistor, and an N-type second transistor;

the first transistor of the first conductivity type and the first transistor of the second conductivity type of the first AND circuit may receive the set signal and may output the first output level;

the first transistor of the first conductivity type and the first transistor of the second conductivity type of the second AND circuit may receive the reset signal and may output the second output level;

the second transistor of the first conductivity type and the second transistor of the second conductivity type of the first AND circuit may receive the second output level;

the second transistor of the first conductivity type and the second transistor of the second conductivity type of the second AND circuit may receive the first output level;

in the first AND circuit, the P-type first transistor and the P-type second transistor may be connected in parallel, the N-type first transistor and the N-type second transistor may be connected in series, and the capability of the P-type first transistor may be lower than the capability of the N-type first transistor and the capability of the N-type second transistor; and in the second AND circuit, the P-type first transistor and the P-type second transistor may be connected in parallel, the N-type first transistor and the N-type second transistor may be connected in series, and the capability of the P-type first transistor may be lower than the capability of the N-type first transistor and the capability of the N-type second transistor.

In the noise filter circuit according to this embodiment, the noise filter circuit may comprise an inverter circuit that receives the input signal, the latch circuit may receive the input signal and a signal output from the inverter circuit as the set signal and the reset signal.

In the noise filter circuit according to this embodiment, each of the first logic circuit and the second logic circuit may be configured so that the capability of the first transistor of either of the first conductivity type and the second conductivity type is lower than the capability of the second transistor of either of the first conductivity type and the second conductivity type.

According to this embodiment, a variation in noise reduction characteristics can be reduced.

In the noise filter circuit according to this embodiment, at least one pair of symmetrical transistors of the latch circuit may have an identical capability.

According to this embodiment, the noise filter circuit has identical noise reduction characteristics with respect to high-side noise and low-side noise.

In the noise filter circuit according to this embodiment, either of the first output level and the second output level may rise gently and then may rise steeply through a change point, the change point being higher than a value equal to half a power supply voltage of the latch circuit; and the other of the first output level and the second output level may fall gently and then may fall steeply through a change point, the change point being lower than a value equal to half the power supply voltage.

This enables the output signal from the noise filter circuit to be delayed to a larger extent with respect to the input signal.

In the noise filter circuit according to this embodiment, the noise filter circuit may comprise a waveform adjusting circuit that receives the output signal from the latch circuit, the noise filter circuit may output a signal output from the waveform adjusting circuit as the output signal.

The noise filter circuit can remove noise contained in the input signal.

In the noise filter circuit according to this embodiment, the output signal from the latch circuit may rise gently and then may rise steeply through a change point, and a first input threshold value of the waveform adjusting circuit is set in a steep portion with respect to the change point; and the output signal from the latch circuit may fall gently and then may fall steeply through a change point, and a second input threshold value of the waveform adjusting circuit is set in a steep portion with respect to the change point.

According to this embodiment, a variation in delay amount can be reduced.

According to another embodiment of the invention, there is provided thermal head driver comprising the above noise filter circuit.

According to another embodiment of the invention, there is provided a thermal head comprising the above thermal head driver.

According to another embodiment of the invention, there is provided an electronic instrument comprising the above noise filter circuit.

According to another embodiment of the invention, there is provided a printing system comprising a printer that includes the above noise filter circuit.

According to another embodiment of the invention, there is provided a noise filtering method comprising:
providing an input signal;
inverting the input signal;
inputting the input signal and a signal obtained by inverting the input signal to a latch circuit as a set signal and a reset signal;

causing the latch circuit to operate so that either of two output levels rises gently and is delayed;
causing the latch circuit to operate so that the other of the two output levels falls gently and is delayed; and
outputting either of the two output levels or the other of the two output levels as an output signal.

In the noise filtering method according to this embodiment, the method may comprise:
causing the latch circuit to operate so that either of the two output levels rises gently and then rises steeply; and
causing the latch circuit to operate so that the other of the two output levels falls gently and then falls steeply.

In the noise filtering method according to this embodiment, the method may comprise:
setting a threshold value in an area where either of the two output levels or the other of the two output levels rises or falls steeply;
adjusting a waveform of either of the two output levels or the other of the two output levels using the threshold value; and
outputting a waveform-adjusted signal as the output signal.

Those skilled in the art would readily appreciate that the above-described embodiments of the invention may be modified without materially departing from the spirit and the scope of the invention. For example, at least one element of one embodiment of the invention may be added to another embodiment of the invention. Alternatively, at least one element of one embodiment of the invention may be replaced by at least one element of another embodiment of the invention.

Specific embodiments of the invention are described in detail below with reference to the drawings. The following specific embodiments are given so that the invention can be readily understood. Accordingly, the invention is not limited to the following specific embodiments.

1. Noise filter circuit 1.1 First Specific Embodiment

FIG. 1 is a schematic block diagram showing a noise filter circuit according to the invention.

A noise filter circuit 10 shown in FIG. 1 includes an inverter circuit 12 that receives an input signal (IN), a latch circuit 14 that receives the input signal (IN) and a signal output from the inverter circuit 12 as a set signal (S) and a reset signal (R), respectively, and a waveform adjusting circuit 16 that adjusts the waveform of a signal output from the latch circuit 14. When a reduction in chip size is given priority, for example, the waveform adjusting circuit 16 may be omitted from the noise filter circuit 10. In other words, another circuit (not shown) in the subsequent stage of the noise filter circuit 10 may adjust the waveform of a signal output from the latch circuit 14.

The inverter circuit 12 inverts the input signal (IN), and outputs the inverted signal. The inverter circuit 12 is formed using a CMOS transistor, for example. The inverter circuit 12 includes a first-conductivity-type transistor and a second-conductivity-type transistor. The capability (current drive capability) of either of the first-conductivity-type transistor and the second-conductivity-type transistor is equal to the capability (current drive capability) of the other of the first-conductivity-type transistor and the second-conductivity-type transistor.

The latch circuit 14 receives the input signal (IN) as the set signal (S). The latch circuit 14 receives the signal output from the inverter circuit 12 as the reset signal (R). The latch circuit 14 stores two output levels (Q and XQ) corresponding to the timings of the set signal (S) and the reset signal (R). The latch circuit 14 outputs one (e.g., XQ) of the two output levels (Q and XQ). The latch circuit 14 is formed using an OR latch circuit (e.g., NOR latch circuit).

Note that the signal XQ is obtained by inverting the signal Q.

The waveform adjusting circuit 16 adjusts the waveform of the signal (XQ) output from the latch circuit 14, and outputs the resulting signal as an output signal (OUT). When the noise filter circuit 10 does not include the waveform adjusting circuit 16, the signal (XQ) output from the latch circuit 14 is used as the output signal (OUT).

The waveform adjusting circuit 16 is an inverter circuit, for example. The waveform adjusting circuit (inverter circuit) 16 is formed using a CMOS transistor, for example. The waveform adjusting circuit 16 includes a first-conductivity-type transistor and a second-conductivity-type transistor. The capability (current drive capability) of either of the first-conductivity-type transistor and the second-conductivity-type transistor is equal to the capability (current drive capability) of the other of the first-conductivity-type transistor and the second-conductivity-type transistor. The waveform adjusting circuit 16 may include a plurality of inverter circuits connected in series. In this case, the waveform adjusting circuit 16 includes a non-inverting waveform adjusting circuit (inverter circuits corresponding to an even number) and an inverting waveform adjusting circuit (inverter circuits corresponding to an odd number).

Figure 2:
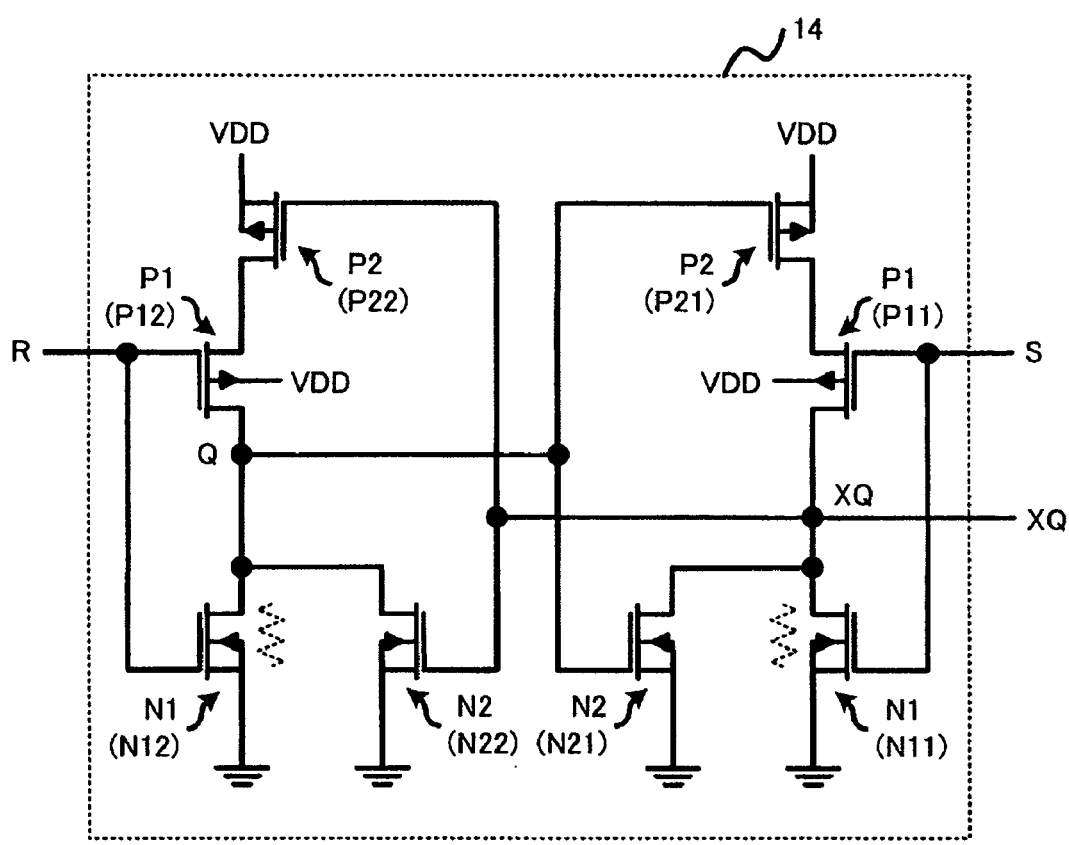
FIG. 2 shows a specific example of a latch circuit 14 shown in FIG. 1.

FIG. 2 shows a specific example of the latch circuit 14 shown in FIG. 1.

As shown in FIGS. 1 and 2, the latch circuit 14 includes a pair of NOR circuits (i.e., two NOR circuits). Either of the two NOR circuits receives the input signal (IN) (set signal (S)) and the signal (Q) output from the other NOR circuit. The other NOR circuit receives the signal output from the inverter circuit 12 (i.e., the reset signal (R) that is a signal obtained by inverting the input signal) and the signal (XQ) output from the NOR circuit that makes a pair with that NOR circuit.

As shown in FIG. 2, each of the two NOR circuits of the latch circuit 14 includes two P-type (first conductivity type) transistors P1 and P2 connected in series, and two N-type (second conductivity type) transistors N1 and N2 connected in parallel.

The input signal (IN) (set signal (S)) is input to the gate of the P-type transistor P1 (i.e., either of the two P-type transistors) and the gate of the N-type transistor N1 (i.e., either of the two N-type transistors) of either of the two NOR circuits. The signal (Q) output from the other NOR circuit is input to the gate of the P-type transistor P2 (i.e., the other P-type transistor) and the gate of the N-type transistor N2 (i.e., the other N-type transistor) of either of the two NOR circuits. The signal (XQ) is output from the drain of the P-type transistor P1 (i.e., either of the two P-type transistors) and the drain of the N-type transistor N1 (i.e., either of the two N-type transistors) of either of the two NOR circuits.

The signal (reset signal (R)) output from the inverter circuit 12 is input to the gate of the P-type transistor P1 (i.e., either of the two P-type transistors) and the gate of the N-type transistor N1 (i.e., either of the two N-type transistors) of the other NOR circuit. The signal (XQ) output from either of the two NOR circuits is input to the gate of the P-type transistor P2 (i.e., the other P-type transistor) and the gate of the N-type transistor N2 (i.e., the other N-type transistor) of the other NOR circuit. The signal (Q) is output from the drain of the P-type transistor P1 (i.e., either of the two P-type transistors) and the drain of the N-type transistor N1 (i.e., either of the two N-type transistors) of the other NOR circuit.

In each of the two NOR circuits of the latch circuit 14, the drain of the transistor P1 is connected to the drains of the transistors N1 and N2. The source of the transistor P1 is connected to the drain of the transistor P2. The source of the transistor P2 is connected to a first potential (VDD). The sources of the transistors N1 and N2 are connected to a second potential (GND). A substrate of the transistors P1 and P2 is connected to the first potential (VDD), and a substrate of the transistors N1 and N2 is connected to the second potential (GND).

The latch circuit 14 shown in FIG. 2 differs from a normal latch circuit as to the following point. Specifically, each of the two NOR circuits is configured so that the capability of the transistor N1 is lower than the capability of a transistor equivalent to the transistors P1 and P2 connected in series.

The channel length and the channel width of the P-type transistor are respectively referred to as Lp and Wp, and the channel length and the channel width of the N-type transistor are respectively referred to as Ln and Wn. For example, when the Wp/Lp ratios of the transistors P1 and P2 are identical, if a value obtained by multiplying the Wn/Ln ratio by a factor of ½ to ⅓ is smaller than a value equivalent to two Wp/Lp ratios (i.e., a value obtained by multiplying the Wp/Lp ratio by a factor of ½ (total capability)), the ON resistance of the N-type transistor N1 is higher than the ON resistance of a transistor equivalent to the P-type transistors P1 and P2. Specifically, the capability of the N-type transistor N1 is lower than the capability (total capability) of a transistor equivalent to the P-type transistors P1 and P2 in each of the two NOR circuits. Since the mobility of electrons is higher than the mobility of holes, the capability of a P-type transistor is generally lower than the capability of an N-type transistor by a factor of ½ to ⅓ when Wp/Lp=Wn/Ln.

In each of the two NOR circuits, the capability of the transistor N1 is preferably lower than the capability of the transistor N2. In the latch circuit 14, the symmetrical transistors that make a pair (i.e., transistors P1 (P11) and P1 (P12); transistors P2 (P21) and P2 (P22); transistors N1 (N11) and N1 (12); and transistors N2 (N21) and N2 (N22)) preferably have an identical capability. Specifically, the latch circuit 14 is preferably configured so that the symmetrical transistors P11 and P12 have an identical capability, the symmetrical transistors P21 and P22 have an identical capability, the symmetrical transistors N11 and N12 have an identical capability, and the symmetrical transistors N21 and N22 have an identical capability. Note that at least one pair of symmetrical transistors may have an identical capability.

For example, the capability of each of the transistors P1 and P2 of each of the two NOR circuits is equal to the capability of the P-type transistor of the inverter circuit 12 shown in FIG. 1 and/or the capability of the P-type transistor of the waveform adjusting circuit 16 shown in FIG. 1.

A specific example of the transistors shown in FIG. 2 is given below. The Wp/Lp ratio of the transistor P1 is 10 (μm)/1 (μm), the Wp/Lp ratio of the transistor P2 is 10 (μm)/1 (μm), the Wn/Ln ratio of the transistor N1 is 1.8 (μm)/10 (μm), and the Wn/Ln ratio of the transistor N2 is 2 (μm)/1 (μm).

Figure 3:
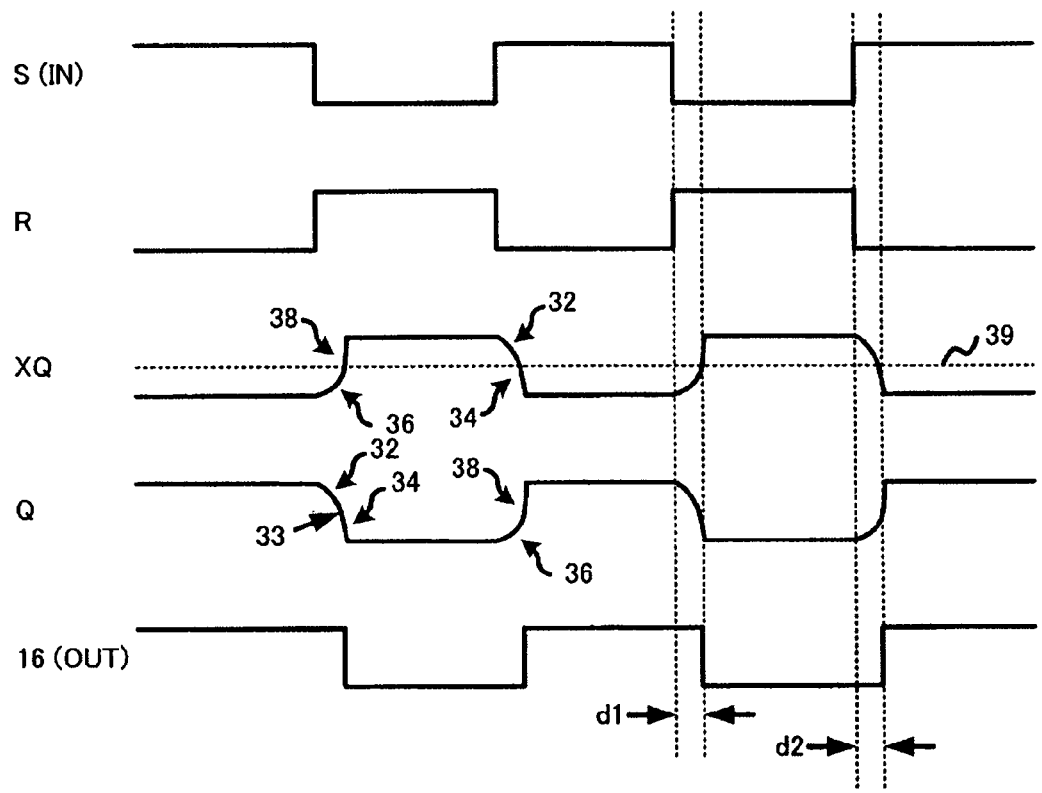
FIG. 3 is a timing diagram illustrative of the operation of a noise filter circuit 10 shown in FIG. 1.

FIG. 3 is a timing diagram illustrative of the operation of the noise filter circuit 10 shown in FIG. 1.

In FIG. 3, reference symbol S (IN) indicates the set signal (S) (i.e., input signal (IN)) input to the latch circuit 14. Reference symbol R indicates the reset signal (i.e., a signal obtained by inverting the input signal (IN) using the inverter circuit 12) input to the latch circuit 14. Reference symbols Q and XQ indicate the two output levels of the latch circuit 14.

Reference symbol 16 (OUT) indicates the signal (i.e., output signal (OUT)) output from the waveform adjusting circuit 16 that adjusts the waveform of the signal (XQ) output from the latch circuit 14. When the noise filter circuit 10 does not include the waveform adjusting circuit 16, one (e.g., Q) of the two output levels of the latch circuit 14 may be used as the output signal (OUT). The input signal (IN) (set signal (S)) shown in FIG. 3 as an example is illustrated using a periodic rectangular wave which does not contain noise.

Each of the two NOR circuits of the latch circuit 14 is configured so that the capability of the transistor N1 is lower than the capability of a transistor equivalent to the transistors P1 and P2 connected in series, as described above. Therefore, one output (Q) of the latch circuit 14 falls gently (see arrow 32) when the transistor N1 that receives the reset signal (R) is turned ON. The capability of the transistor N2 is higher than the capability of the transistor N1, as described above. Therefore, feedback due to the transistor N2 occurs when the transistor N2 that receives the output signal (XQ) of the latch circuit 14 is turned ON, whereby one output (Q) of the latch circuit 14 falls steeply (see arrow 34). Specifically, one output (Q) of the latch circuit 14 falls gently and then falls steeply. In other words, one output (Q) of the latch circuit 14 falls through a change point (see arrow 33). The other output (XQ) of the latch circuit 14 rises gently (see arrow 36) and then rises steeply (see arrow 38) corresponding to the falling process of one output (Q) of the latch circuit 14.

When the two NOR circuits of the latch circuit 14 are symmetrical, the other output (XQ) of the latch circuit 14 falls (32 and 34) in the same manner as one output (Q) of the latch circuit 14. Likewise, the other output (XQ) of the latch circuit 14 rises (36 and 38) in the same manner as one output (Q) of the latch circuit 14.

In FIG. 3, a dotted line 39 indicates an input threshold value 39 of the waveform adjusting circuit 16 (e.g., a value equal to half the power supply voltage VDD of the latch circuit 14). Therefore, the output signal (OUT) output from the noise filter circuit 10 (waveform adjusting circuit 16) is delayed (by delay amounts d1 and d2) with respect to the input signal (IN), as shown in FIG. 3. Specifically, the latch circuit 14 can delay the set signal (S) and the reset signal (R). The latch circuit 14 differs from a normal latch circuit as to the above-described point.

Figure 4:
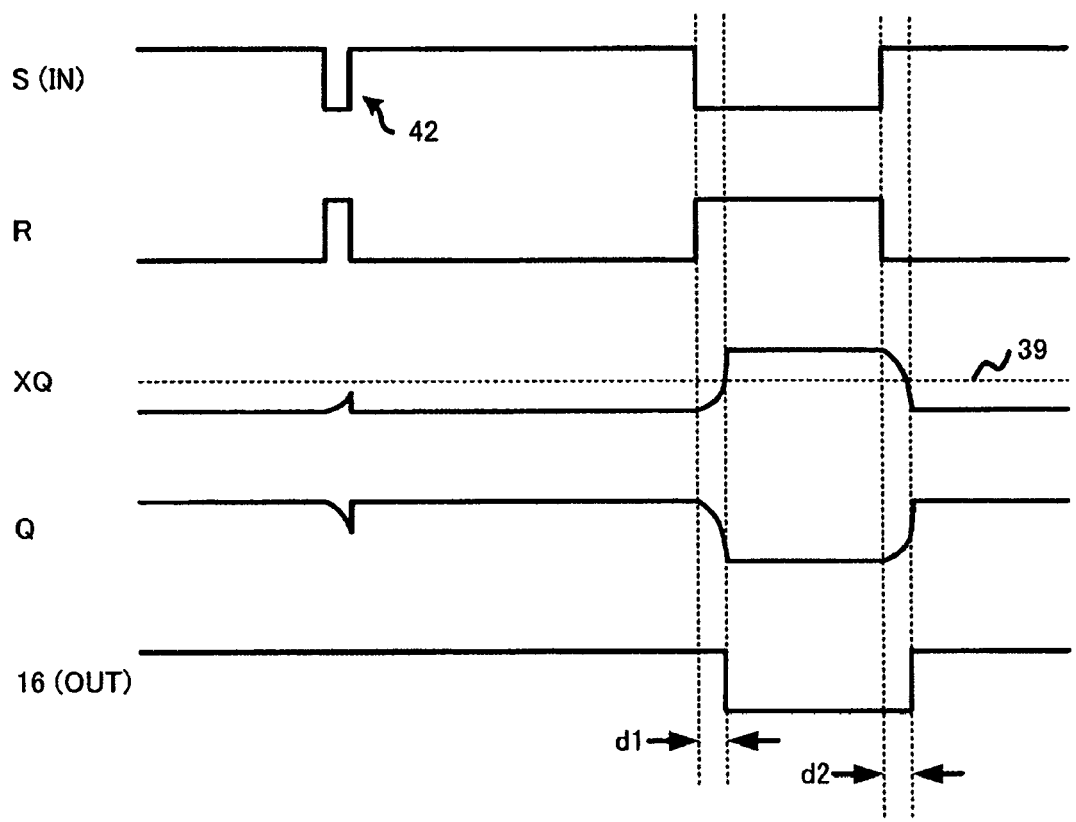
FIG. 4 is another timing diagram illustrative of the operation of the noise filter circuit 10 shown in FIG. 1.

FIG. 4 is another timing diagram illustrative of the operation of the noise filter circuit 10 shown in FIG. 1.

The input signal (IN) (set signal (S)) shown in FIG. 4 as an example contains low-side noise 42. The noise 42 does not exceed the input threshold value 39 as long as the pulse width of the noise 42 does not exceed a first delay amount d1. Therefore, the noise filter circuit 10 can remove noise (i.e., low-side noise 42) having a pulse width smaller than the first delay amount d1.

When the capability of the transistor N2 is higher than the capability of the transistor N1, one output (Q) of the latch circuit 14 falls steeply (34), and the other output (XQ) of the latch circuit 14 rises steeply (38). Since the other output (XQ) rises steeply (38) across the input threshold value 39, a variation in the first delay amount d1 can be reduced. Specifically, a variation in characteristics of the noise filter circuit 10 can be reduced. Note that the change point (33) may be changed by changing the relationship between the capability of the transistor N2 and the capability of a transistor equivalent to the transistors P1 and P2 connected in series. The input threshold value 39 is set at a value equal to half the power supply voltage VDD of the latch circuit 14. Note that the input threshold value 39 may be set in the steep area (34 or 38) with respect to the change point (33) by adjusting the input threshold value 39 (e.g., two input threshold values of a Schmitt circuit).

When the noise filter circuit 10 does not include the waveform adjusting circuit 16, the noise filter circuit 10 may output one (e.g., Q) of the two outputs of the latch circuit 14 as the output signal (OUT). In FIG. 1, the inverter circuit 12 may be disposed on the set (S) signal side instead of the reset signal (R) side, and the noise filter circuit 10 may output one (e.g., XQ) of the two outputs of the latch circuit 14 as the output signal (OUT).

Figure 5:
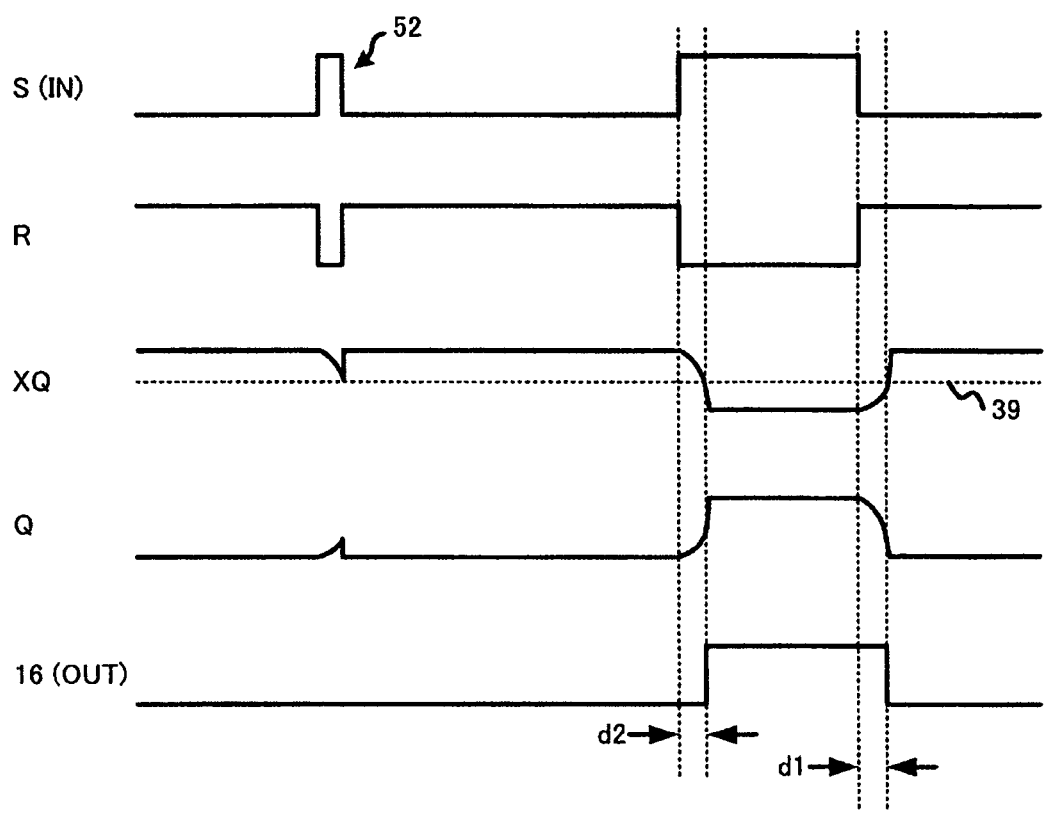
FIG. 5 is yet another timing diagram illustrative of the operation of the noise filter circuit 10 shown in FIG. 1.

FIG. 5 is yet another timing diagram illustrative of the operation of the noise filter circuit 10 shown in FIG. 1.

The input signal (IN) (set signal (S)) shown in FIG. 5 as an example contains high-side noise 52. The noise 52 does not exceed the input threshold value 39 as long as the pulse width of the noise 52 does not exceed a second delay amount d2. Therefore, the noise filter circuit 10 can remove the high-side noise 52 having a pulse width smaller than the second delay amount d2.

When the latch circuit 14 is configured so that two symmetrical transistors (two transistors P1; two transistors P2; two transistors N1; and two transistors N2) have an identical capability, the second delay amount d2 is equal to the first delay amount d1. Specifically, the noise filter circuit 10 has identical noise reduction characteristics with respect to the high-side noise 52 and the low-side noise 42.

A related-art noise filter circuit is disclosed in FIG. 1 of JP-A-2003-163583, for example. In such a related-art noise filter circuit, a delay circuit, a NAND circuit, and an OR circuit are disposed between an input signal and a latch circuit. As shown in FIG. 1, the noise filter circuit 10 includes the inverter circuit 12 having a simple structure instead of a delay circuit, a NAND circuit and an OR circuit. The noise filter circuit 10 shown in FIG. 1 thus has a simple structure. Therefore, the noise filter circuit 10 can be formed with a reduced chip size as compared with a related-art noise filter circuit.

When the input signal (IN) contains noise that occurs successively (e.g., the high-side noise 52 shown in FIG. 5 occurs at an interval Di), if the interval Di at which the high-side noise occurs successively is smaller than the sum of a delay amount D1 of a delay circuit and a pulse width Dp of the noise (Di<Di+Dp), a NAND circuit of a related-art noise filter circuit has noise corresponding to the successive high-side noise. In a related-art noise filter circuit, a signal output from a NAND circuit 122 is used as a set signal of a latch circuit. Therefore, a signal output from a related-art noise filter circuit contains noise due to the successive high-side noise. Likewise, a signal output from a related-art noise filter circuit contains noise due to successive low-side noise.

According to the noise filter circuit 10 shown in FIG. 1, even if the high-side noise 52 successively occurs, the noise does not exceed the input threshold value 39. Therefore, the noise filter circuit 10 can remove the successive high-side noise having a pulse width smaller than the second delay amount d2. Likewise, the noise filter circuit 10 can remove successive low-side noise.

Second Specific Embodiment

Figure 6:
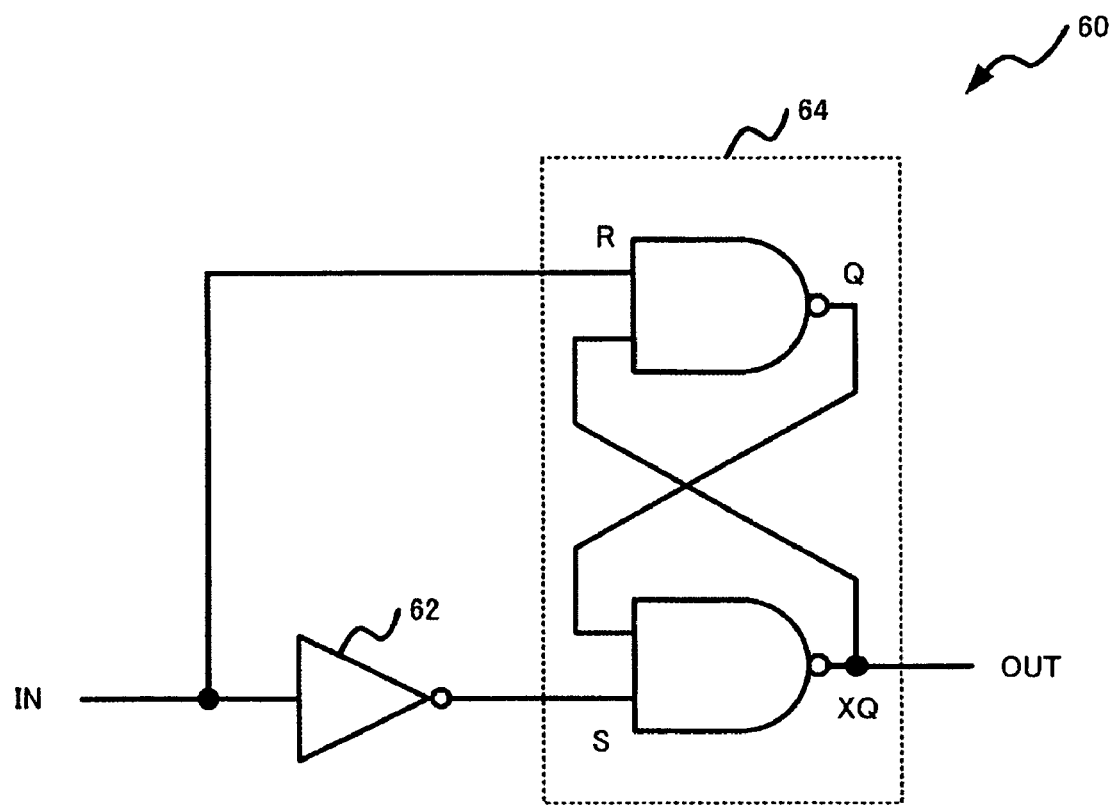
FIG. 6 is a schematic block diagram showing another noise filter circuit (second specific embodiment) according to the invention.

FIG. 6 is a schematic block diagram showing another noise filter circuit according to the invention.

A noise filter circuit 60 shown in FIG. 6 includes an inverter circuit 62 that receives an input signal (IN), and a latch circuit 64 that receives a signal output from the inverter circuit 12 and the input signal (IN) as a set signal (S) and a reset signal (R), respectively. The noise filter circuit 60 may include a waveform adjusting circuit (e.g., non-inverting waveform adjusting circuit) that adjusts the waveform of a signal output from the latch circuit 64.

The inverter circuit 62 inverts the input signal (IN), and outputs the inverted signal. The inverter circuit 62 is formed using a CMOS transistor, for example.

The latch circuit 64 receives the signal output from the inverter circuit 62 as the set signal (S). The latch circuit 64 receives the input signal (IN) as the reset signal (R). The latch circuit 64 stores two output levels (Q and XQ) corresponding to the timings of the set signal (S) and the reset signal (R). The latch circuit 64 outputs one (e.g., XQ) of the two output levels (Q and XQ). The latch circuit 64 is formed using an AND latch circuit (e.g., NAND latch circuit).

Note that the latch circuit 64 may output one (e.g., Q) of the two output levels as an output signal (OUT), and the noise filter circuit 60 may include an inverting waveform adjusting circuit.

Figure 7:
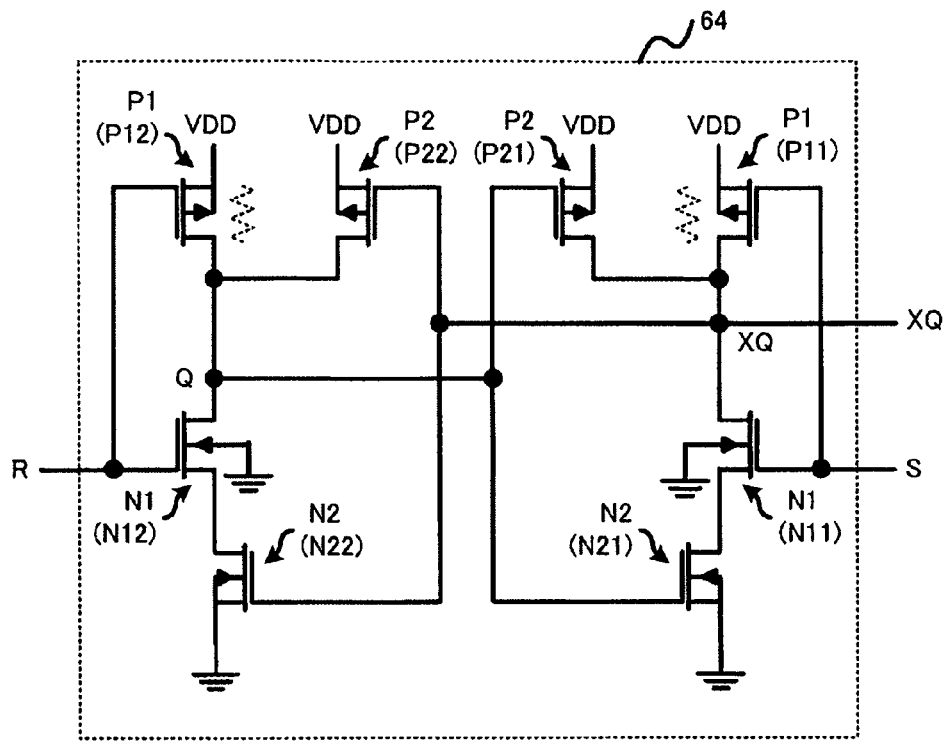
FIG. 7 shows a specific example of the latch circuit 64 shown in FIG. 6.

FIG. 7 shows a specific example of the latch circuit 64 shown in FIG. 6.

As shown in FIGS. 6 and 7, the latch circuit 64 includes a pair of NAND circuits (i.e., two NAND circuits). Either of the two NAND circuits receives the signal output from the inverter circuit 62 (i.e., the set signal (S) that is a signal obtained by inverting the input signal) and the signal (Q) output from the other NAND circuit. The other NAND circuit receives the input signal (IN) (reset signal (R)) and the signal (XQ) output from the first NAND circuit.

As shown in FIG. 7, each of the two NAND circuits of the latch circuit 64 includes two P-type (first conductivity type) transistors P1 and P2 connected in parallel, and two N-type (second conductivity type) transistors N1 and N2 connected in series.

The set signal (S) is input to the gate of the P-type transistor P1 (i.e., either of the two P-type transistors) and the gate of the N-type transistor N1 (i.e., either of the two N-type transistors) of either of the two NAND circuits. The signal (Q) output from the other NAND circuit is input to the gate of the P-type transistor P2 (i.e., the other P-type transistor) and the gate of the N-type transistor N2 (i.e., the other N-type transistor) of either of the two NAND circuits. The signal (XQ) is output from the drain of the P-type transistor P1 (i.e., either of the two P-type transistors) and the drain of the N-type transistor N1 (i.e., either of the two N-type transistors) of either of the two NAND circuits.

The reset signal (R) is input to the gate of the P-type transistor P1 (i.e., either of the two P-type transistors) and the gate of the N-type transistor N1 (i.e., either of the two N-type transistors) of the other NAND circuit. The signal (XQ) output from either of the two NAND circuits is input to the gate of the P-type transistor P2 (i.e., the other P-type transistor) and the gate of the N-type transistor N2 (i.e., the other N-type transistor) of the other NAND circuit. The signal (Q) is output from the drain of the P-type transistor P1 (i.e., either of the two P-type transistors) and the drain of the N-type transistor N1 (i.e., either of the two N-type transistors) of the other NAND circuit.

In each of the two NAND circuits of the latch circuit 64, the drain of the transistor N1 is connected to the drains of the transistors P1 and P2. The source of the transistor N1 is connected to the drain of the transistor N2. The source of the transistor N2 is connected to a second potential (GND). The sources of the transistors P1 and P2 are connected to a first potential (VDD). A substrate of the transistors N1 and N2 is connected to the second potential (GND), and a substrate of the transistors P1 and P2 is connected to the first potential (VDD).

The latch circuit 64 shown in FIG. 7 differs from a normal latch circuit as to the following point. Specifically, in each of the two NAND circuits, the capability of the transistor P1 is lower than the capability of a transistor equivalent to the transistors N1 and N2 connected in series.

In each of the two NAND circuits, the capability of the transistor P1 is preferably lower than the capability of the transistor P2. The latch circuit 14 is preferably configured so that two symmetrical transistors (transistors P1; transistors P2; transistors N1; and transistors N2) have an identical capability.

For example, the capability of each of the transistors N1 and N2 of each of the two NAND circuits is equal to the capability of the N-type transistor of the inverter circuit 62 shown in FIG. 6.

A specific example of the transistors shown in FIG. 7 is given below. The Wp/Lp ratio of the transistor P1 is 1.8 ($\mu$m)/6 ($\mu$m), the Wp/Lp ratio of the transistor P2 is 5 ($\mu$m)/1 ($\mu$m), the Wn/Ln ratio of the transistor N1 is 5 ($\mu$m)/1 ($\mu$m), and the Wn/Ln ratio of the transistor N2 is 5 ($\mu$m)/1 ($\mu$m).

According to the specific example of the transistors shown in FIG. 7 in which the capability of the P-type transistor is decreased, the gate area can be reduced as compared with the specific example of the transistors shown in FIG. 2. Therefore, the noise filter circuit 60 can be formed with a reduced chip size as compared with the noise filter circuit 10.

Figure 8:
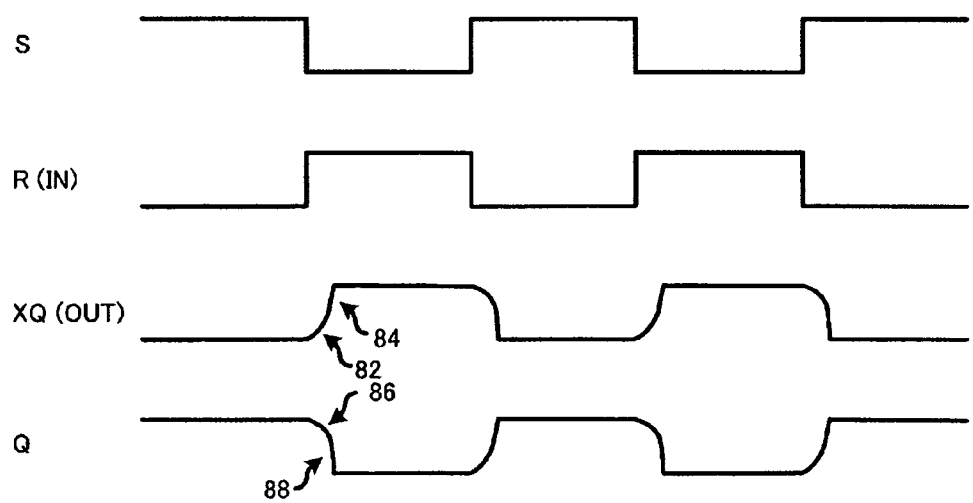
FIG. 8 is a timing diagram illustrative of the operation of a noise filter circuit 60 shown in FIG. 6.

FIG. 8 is a timing diagram illustrative of the operation of the noise filter circuit 60 shown in FIG. 6.

In FIG. 8, reference symbol S indicates the set signal (S) (i.e., a signal obtained by inverting the input signal (IN) using the inverter circuit 62) input to the latch circuit 64. Reference symbol R (IN) indicates the reset signal (i.e., input signal (IN)) input to the latch circuit 64. Reference symbols Q and XQ indicate the two output levels of the latch circuit 64. The input signal (IN) (reset signal (S)) shown in FIG. 8 as an example is illustrated using a periodic rectangular wave which does not contain noise.

In each of the two NAND circuits of the latch circuit 64, the capability of the transistor P1 is lower than the capability of a transistor equivalent to the transistors N1 and N2 connected in series, as described above. Therefore, one output (XQ) of the latch circuit 64 rises gently (see arrow 82) when the transistor P1 that receives the set signal (S) is turned ON. The capability of the transistor P2 is higher than the capability of the transistor P1, as described above. Therefore, feedback due to the transistor P2 occurs when the transistor P2 that receives the output signal (Q) of the latch circuit 64 is turned ON, whereby one output (XQ) of the latch circuit 64 rises steeply (see arrow 84). Specifically, one output (XQ) of the latch circuit 64 rises gently and then rises steeply. In other words, one output (XQ) of the latch circuit 64 rises through a change point. The other output (Q) of the latch circuit 64 falls gently (see arrow 86) and then falls steeply (see arrow 88) corresponding to the rising process of one output (XQ) of the latch circuit 64. Specifically, the latch circuit 64 can delay the set signal (S) and the reset signal (R).

Figure 9:
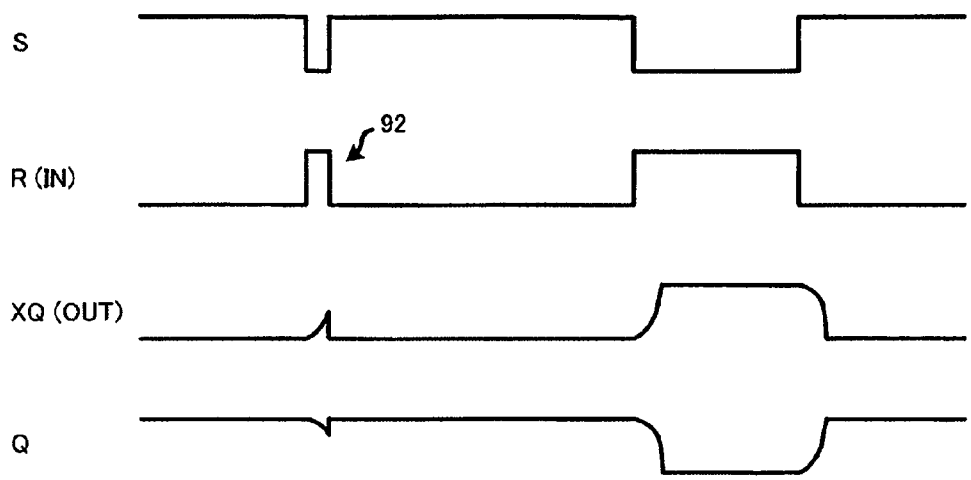
FIG. 9 is another timing diagram illustrative of the operation of the noise filter circuit 60 shown in FIG. 6.

FIG. 9 is another timing diagram illustrative of the operation of the noise filter circuit 60 shown in FIG. 6.

The input signal (IN) (reset signal (R)) shown in FIG. 9 as an example contains high-side noise 92. Since the output signal (XQ or OUT) from the latch circuit 64 rises gently, the noise filter circuit 60 can reduce the noise 92.

Figure 10:
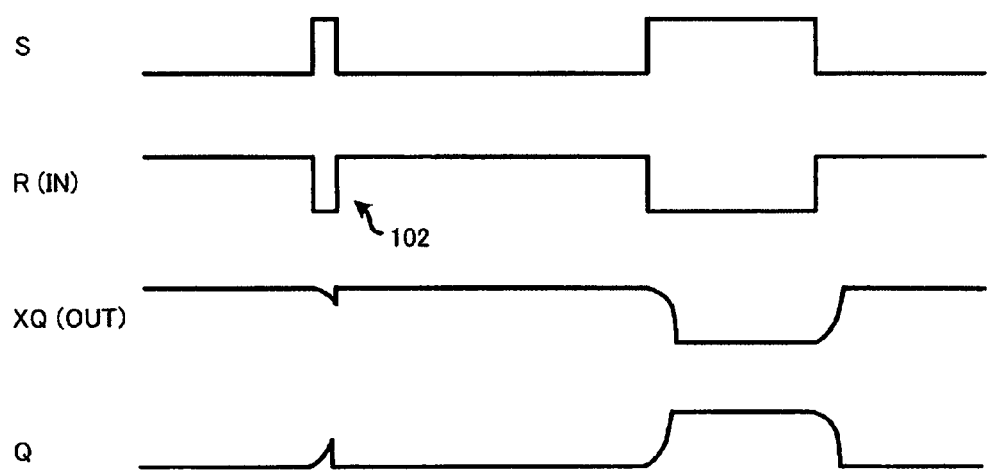
FIG. 10 is yet another timing diagram illustrative of the operation of the noise filter circuit 60 shown in FIG. 6.

FIG. 10 is yet another timing diagram illustrative of the operation of the noise filter circuit 60 shown in FIG. 6.

The input signal (IN) (reset signal (R)) shown in FIG. 10 as an example contains low-side noise 102. Since the output signal (XQ or OUT) from the latch circuit 64 falls gently, the noise filter circuit 60 can reduce the noise 102.

A circuit (not shown) in the subsequent stage of the noise filter circuit 60 adjusts the waveform of the signal output from the latch circuit 64 so that the noise 92 and the noise 102 are removed. Specifically, the noise 92 and the noise 102 reduced by the noise filter circuit 60 do not affect a circuit in the subsequent stage.

2. Thermal Head Driver, Thermal Head, Electronic Instrument, and Printing System

2.1 Thermal Head

Figure 11:
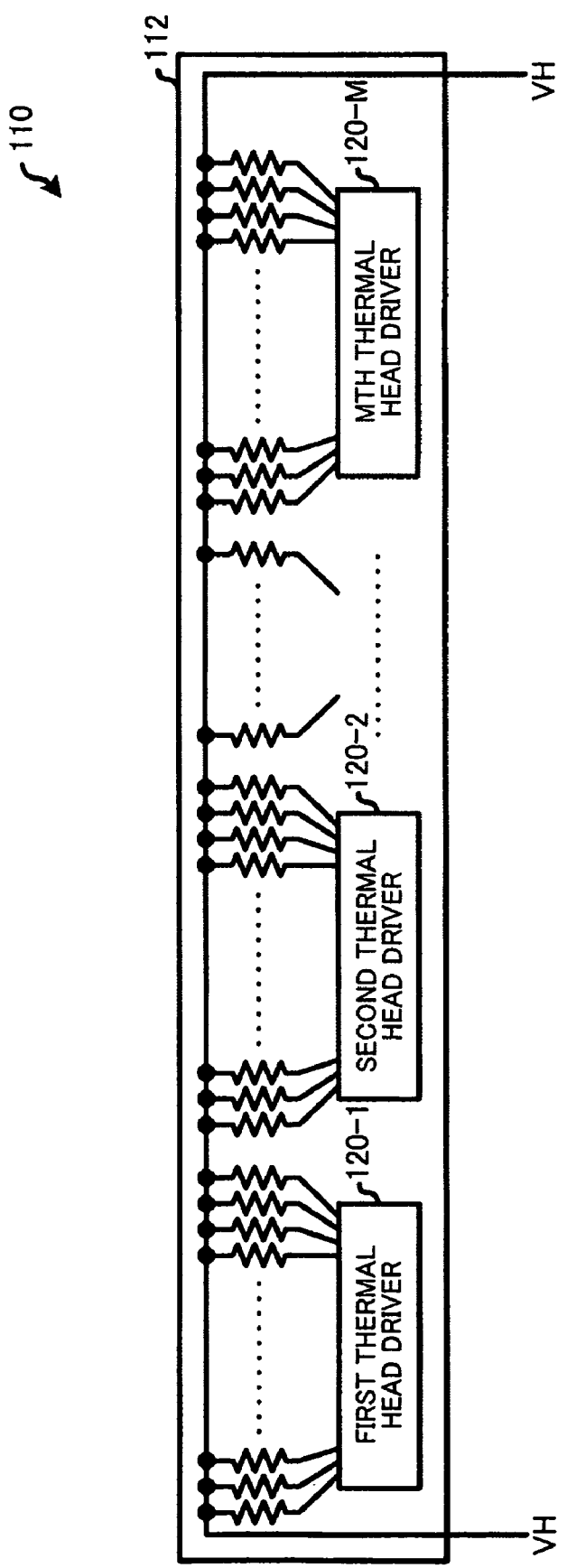
FIG. 11 is a schematic block diagram showing a thermal head according to the invention.

FIG. 11 is a schematic block diagram showing a thermal head according to the invention.

A thermal head 110 shown in FIG. 11 includes a plurality of thermal resistor elements (heating elements or heating resistors in a broad sense) formed on a ceramic sheet 112. In FIG. 11, the thermal resistor elements are arranged along the edge of one long side of the ceramic sheet 112 at intervals corresponding to pixels. A power supply voltage VH is supplied to one end of the thermal resistor elements. The power supply voltage VH is a high voltage (e.g., 24V or 18V) supplied from the outside of the thermal head 110 (ceramic sheet 112). The thermal head 110 includes first to Mth (M is an integer equal to or larger than two) thermal head drivers 120-1, 120-2, . . . , and 120-M. The outputs of the first to Mth thermal head drivers 120-1, 120-2, . . . , and 120-M are electrically connected to the other ends of the thermal resistor elements.

Each of the first to Mth thermal head drivers 120-1, 120-2, . . . , and 120-M causes a current to flow through the thermal resistor element (drives the thermal resistor element) by setting the output of an output driver connected to the thermal resistor element at a ground power supply voltage, for example.

2.2 Thermal Head Driver

Figure 12:
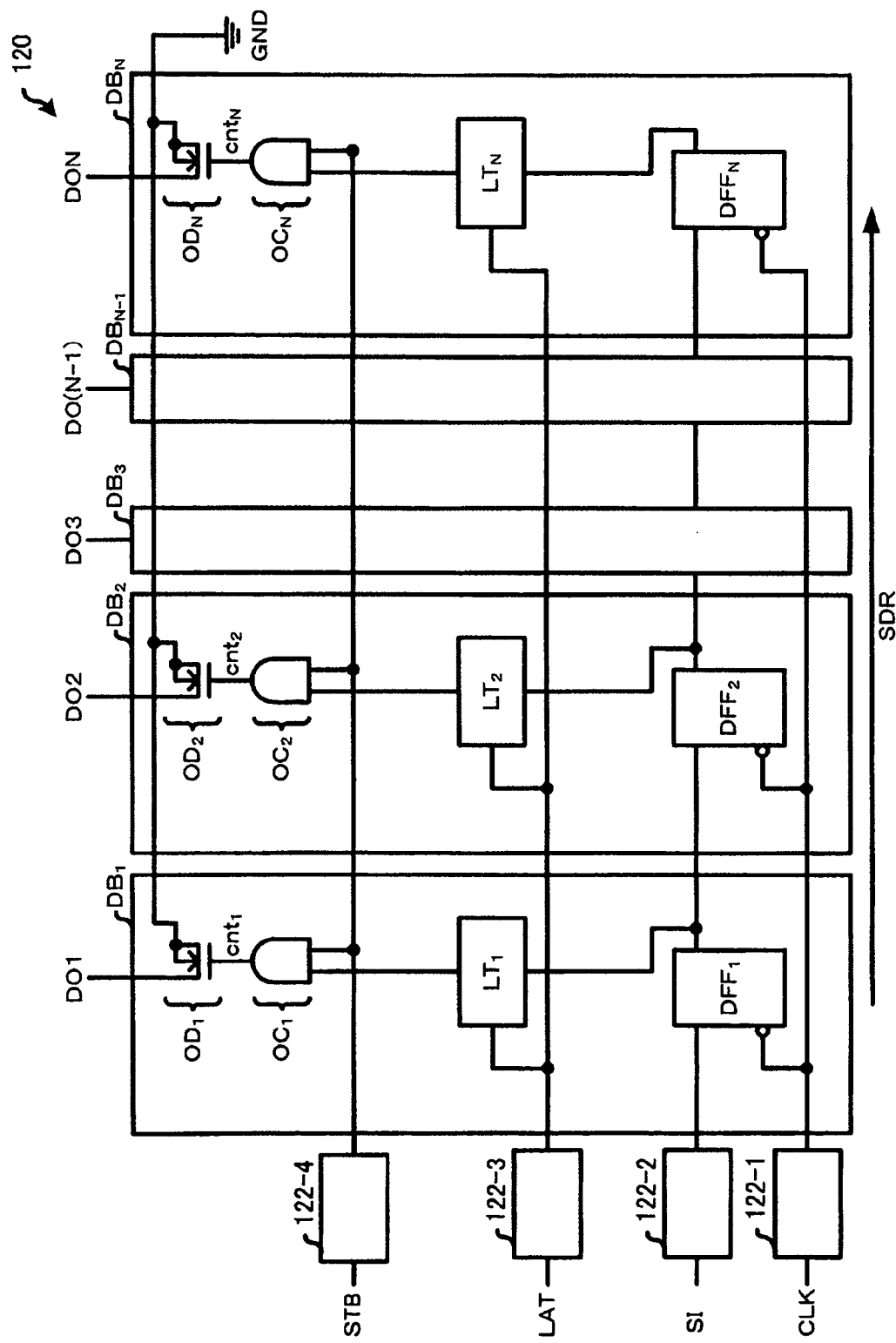
FIG. 12 shows a specific example of each thermal head driver 120 shown in FIG. 11.

FIG. 12 shows a specific example of the thermal head driver 120 shown in FIG. 1.

The thermal head driver 120 shown in FIG. 12 includes noise filter circuits 122-1, 122-2, 122-3, and 122-4 provided in an input section. The noise filter circuits 122-1, 122-2, 122-3, and 122-4 are formed using the above-described noise filter circuit (e.g., the noise filter circuit 10 or 60 shown in FIG. 1 or 6).

The noise filter circuits 122-1, 122-2, 122-3, and 122-4 can be formed with a reduced chip size. Therefore, a small thermal head driver can be provided at low cost.

The thermal head driver 120 includes a plurality of driver blocks $DB_1$ to $DB_N$ (N is an integer equal to or larger than two). The driver block $DB_j$ ($1 \leq j \leq N$, j is an integer) may include an output driver $OD_j$, a latch $LT_j$, and a flip-flop $DFF_j$.

A clock signal CLK, serial data SI, a latch signal LAT, and a strobe signal STB are input to the thermal head driver 120 through the noise filter circuits 122-1, 122-2, 122-3, and 122-3. Pixel data is serially input as the serial data SI in synchronization with the clock signal CLK. The latch signal LAT is a signal for the latches $LT_1$ to $LT_N$ to latch the pixel data corresponding to one line. The strobe signal STB is supplied to the driver blocks $DB_1$ to $DB_N$.

The flip-flops $DFF_1$ to $DFF_N$ of the driver blocks $DB_1$ to $DB_N$ form a shift register that shifts the pixel data input as the serial data SI in a shift direction SDR. Each flip-flop of the shift register holds the output from the flip-flop in the preceding stage and outputs the held data in synchronization with the change timing of the clock signal CLK.

The latch $LT_j$ latches (holds) the data held by the flip-flop $DFF_j$ when the latch signal LAT is set at the H level, for example. The data latched by the latch LTj is input to an output control circuit $OC_j$. The output control circuit $OC_j$ generates an output control signal $cnt_1$ that controls the output from the output driver $OD_1$.

The output driver $OD_j$ includes an N-type metal-oxide-semiconductor (MOS) transistor (hereinafter referred to as "MOS transistor"). A driver output DOj is output from the drain of the MOS transistor. A ground power supply voltage GND is supplied to the sources of the MOS transistors that form the output drivers $OD_1$ to $OD_N$ of the driver blocks $DB_1$ to $DB_N$. The output control signal $cnt_j$ from the output control circuit $OC_j$ is supplied to the gate of the MOS transistor that forms the output driver $OD_j$. In FIG. 12, the driver output $DO_j$ is set at the ground power supply voltage GND by electrically connecting the source and the drain of the MOS transistor that forms the output driver $OD_j$ using the output control signal $cnt_j$.

The output control circuit $OC_j$ generates the output control signal $cnt_j$ based on the strobe signal STB and the pixel data (pixel data latched by the latch $LT_j$) corresponding to the driver block $DB_j$.

2.2.1 Modification

An integrated circuit (e.g., display driver (e.g., liquid crystal driver, plasma panel driver, LED display driver, or organic EL display driver) or printer driver (e.g., LED printhead driver or organic EL printhead driver) other than the thermal head driver 120 may include the above-described noise filter circuit provided in an input section or inside the integrated circuit (e.g., a circuit near a circuit that tends to generate noise, or a circuit connected to a signal line disposed near a circuit that tends to generate noise). A circuit utilizing a discrete element may also include the above-described noise filter circuit.

2.3 Electronic Instrument

Figure 13:
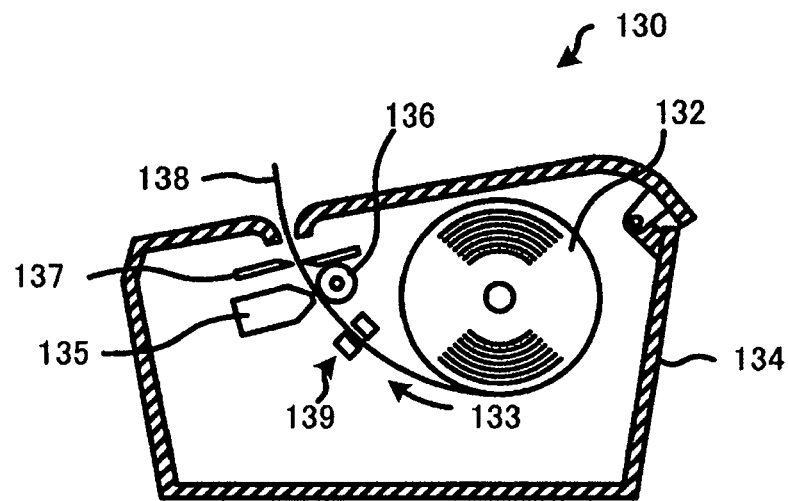
FIG. 13 is a vertical cross-sectional view showing only the main portion of a specific example of a thermal printer that includes a thermal head 110 shown in FIG. 11.

FIG. 13 is a vertical cross-sectional view showing only the main portion of a specific example of a thermal printer that includes the thermal head 110 shown in FIG. 11.

Rolled thermal paper 132 is provided in a printer 130. The printing target portion of the rolled paper 132 is supplied in a paper feed direction 133 by one line using a given paper feed mechanism (paper feed means). The printing target portion is guided toward a print head 135 inside a housing 134. The print head 135 includes the thermal head 110 shown in FIG. 11. When the printing target portion of the rolled paper 132 passes through the space between the print head 135 and a platen 136, a given image is printed on the printing target portion using the print head 135.

The paper feed mechanism further advances the printing target portion in the paper feed direction 133. The rolled paper 132 is then cut with a cutter 137, and removed as a receipt 138.

A paper end sensor 139 is provided in the housing 134 in the preceding stage of the print head 135 so that the edge of the rolled paper 132 can be detected when the rolled paper 132 is supplied in the paper feed direction 133.

2.3.1 Modification

An electronic instrument (e.g., liquid crystal device) other than the thermal printer 130 may also include a control circuit that includes the above-described noise filter circuit.

2.4 Printing System

Figure 14:
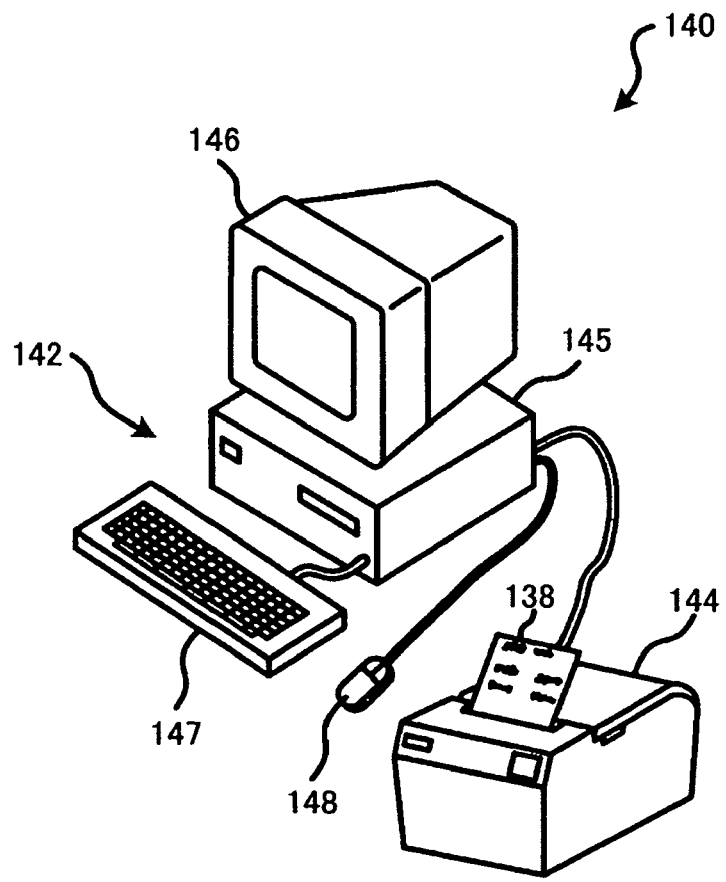
FIG. 14 shows a specific example of a printing system including the thermal head 110 shown in FIG. 11.

FIG. 14 shows a specific example of a printing system including the thermal head 110 shown in FIG. 11.

A printing system 140 shown in FIG. 14 includes a host computer 142 (control section in a broad sense), and a printer 144 that produces the receipt 138 or the like. The host computer 142 includes a main body 145, a display device 146, a keyboard 147, and a mouse 148 as a pointing device.

The printer 144 is formed using the printer 130 shown in FIG. 13, for example.

Figure 15:
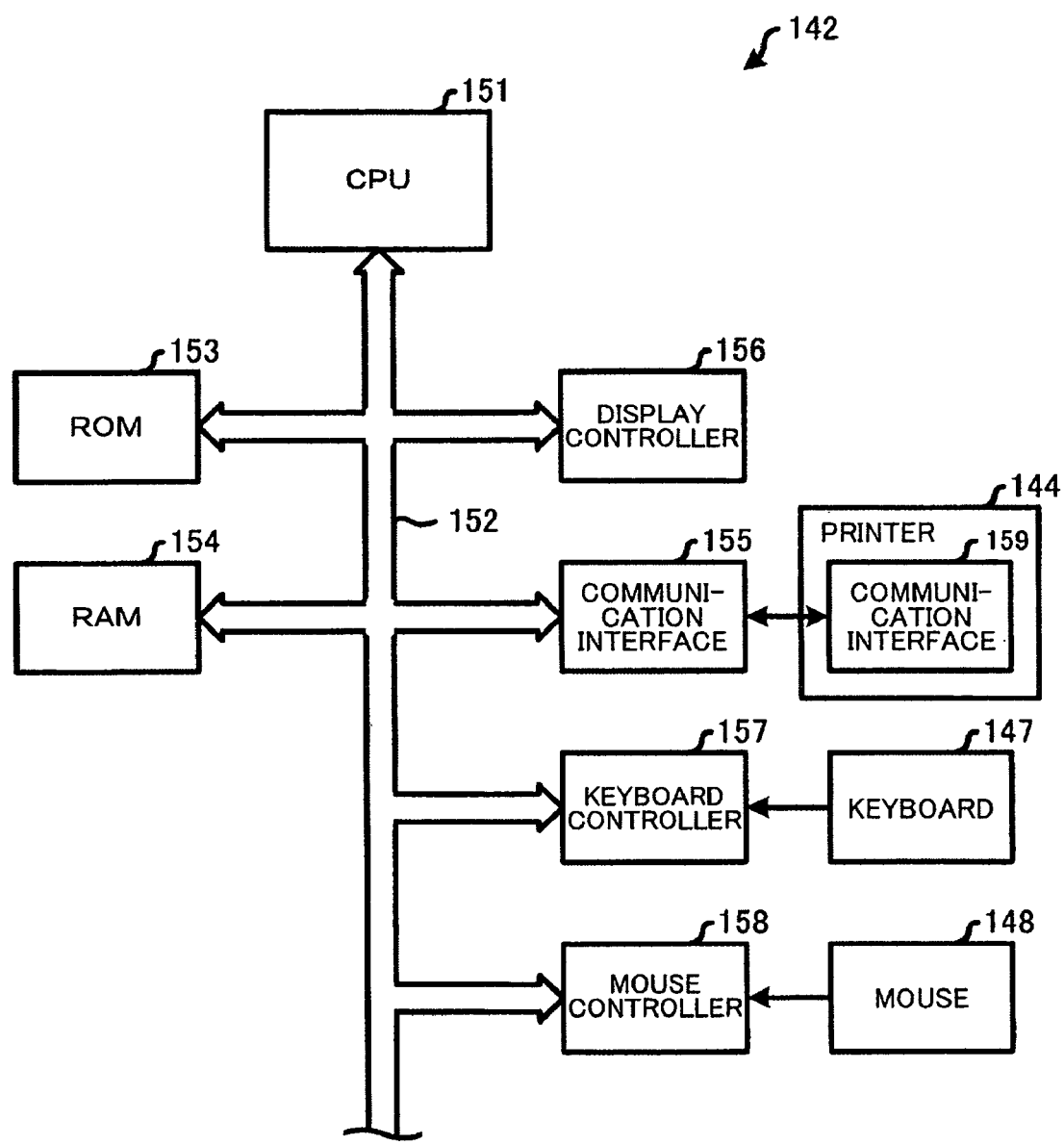
FIG. 15 is a schematic block diagram showing the host computer 142 shown in FIG. 14.

FIG. 15 is a schematic block diagram showing the host computer 142 shown in FIG. 14.

In the host computer 142, a read only memory (ROM) 153 that stores program data and the like, a random access memory (RAM) 154 that serves as a data processing work area and buffers print data, a communication interface 155 that transmits print data, a print command, and the like to the printer 144, a display controller 156 that causes the display device 146 to display characters and the like corresponding to display data, a keyboard controller 157 that receives a key signal corresponding to an input key from the keyboard 147, and a mouse controller 158 that controls data communication or the like with the mouse 148 are connected to a central processing unit (CPU) 151 through a bus line 152. The printer 144 also includes a communication interface 159 that receives print data and the like from the communication interface 155.

The CPU 151 executes a given print process based on a program stored in the ROM 153 or the RAM 154. The CPU 151 load the print data into the RAM 154, or transfers the print data stored in the RAM 154 to the printer 144 through the communication interface 155.

2.4.1 Modification

A system other than the printing system 140 may also include an electronic instrument that includes the above-described noise filter circuit.

Although only some embodiments of the invention have been described in detail above, those skilled in the art would readily appreciate that many modifications are possible in the embodiments without materially departing from the novel teachings and advantages of the invention. Accordingly, such modifications are intended to be included within the scope of the invention.

What is claimed is:

1. A noise filter circuit comprising a latch circuit that receives an input signal,
   the latch circuit including a first logic circuit and a second logic circuit;
   each of the first logic circuit and the second logic circuit including a first transistor of a first conductivity type, a first transistor of a second conductivity type, a second transistor of the first conductivity type, and a second transistor of the second conductivity type;
   the first transistor of the first conductivity type and the first transistor of the second conductivity type of either of the first logic circuit and the second logic circuit receiving a set signal and outputting a first output level;
   the first transistor of the first conductivity type and the first transistor of the second conductivity type of the other of the first logic circuit and the second logic circuit receiving a reset signal and outputting a second output level;
   the second transistor of the first conductivity type and the second transistor of the second conductivity type of either of the first logic circuit or the second logic circuit receiving the second output level;
   the second transistor of the first conductivity type and the second transistor of the second conductivity type of the other of the first logic circuit and the second logic circuit receiving the first output level;
   each of the first logic circuit and the second logic circuit being configured so that:
   the first transistor of either of the first conductivity type and the second conductivity type is connected in parallel to the second transistor of either of the first conductivity type and the second conductivity type;
   the first transistor of the other of the first conductivity type and the second conductivity type is connected in series to the second transistor of the other of the first conductivity type and the second conductivity type; and
   the capability of the first transistor of either of the first conductivity type and the second conductivity type is lower than the capability of the first transistor of the other of the first conductivity type and the second conductivity type and the capability of the second transistor of the other of the first conductivity type and the second conductivity type combined; and
   the latch circuit outputting the first output level or the second output level as an output signal.

2. The noise filter circuit as defined in claim 1,
   the first logic circuit and the second logic circuit being a first OR circuit and a second OR circuit, respectively;
   the first OR circuit including a P-type first transistor, an N-type first transistor, a P-type second transistor, and an N-type second transistor;
   the second OR circuit including a P-type first transistor, an N-type first transistor, a P-type second transistor, and an N-type second transistor;
   the first transistor of the first conductivity type and the first transistor of the second conductivity type of the first OR circuit receiving the set signal and outputting the first output level;
   the first transistor of the first conductivity type and the first transistor of the second conductivity type of the second OR circuit receiving the reset signal and outputting the second output level;
   the second transistor of the first conductivity type and the second transistor of the second conductivity type of the first OR circuit receiving the second output level;
   the second transistor of the first conductivity type and the second transistor of the second conductivity type of the second OR circuit receiving the first output level;
   in the first OR circuit, the N-type first transistor and the N-type second transistor being connected in parallel, the P-type first transistor and the P-type second transistor being connected in series, and the capability of the N-type first transistor being lower than the capability of the P-type first transistor and the capability of the P-type second transistor; and
   in the second OR circuit, the N-type first transistor and the N-type second transistor being connected in parallel, the P-type first transistor and the P-type second transistor being connected in series, and the capability of the N-type first transistor being lower than the capability of the P-type first transistor and the capability of the P-type second transistor.

3. The noise filter circuit as defined in claim 1,
   the first logic circuit and the second logic circuit being a first AND circuit and a second AND circuit, respectively;

the first AND circuit including a P-type first transistor, an N-type first transistor, a P-type second transistor, and an N-type second transistor;

the second AND circuit including a P-type first transistor, an N-type first transistor, a P-type second transistor, and an N-type second transistor;

the first transistor of the first conductivity type and the first transistor of the second conductivity type of the first AND circuit receiving the set signal and outputting the first output level;

the first transistor of the first conductivity type and the first transistor of the second conductivity type of the second AND circuit receiving the reset signal and outputting the second output level;

the second transistor of the first conductivity type and the second transistor of the second conductivity type of the first AND circuit receiving the second output level;

the second transistor of the first conductivity type and the second transistor of the second conductivity type of the second AND circuit receiving the first output level;

in the first AND circuit, the P-type first transistor and the P-type second transistor being connected in parallel, the N-type first transistor and the N-type second transistor being connected in series, and the capability of the P-type first transistor being lower than the capability of the N-type first transistor and the capability of the N-type second transistor; and in the second AND circuit, the P-type first transistor and the P-type second transistor being connected in parallel, the N-type first transistor and the N-type second transistor being connected in series, and the capability of the P-type first transistor being lower than the capability of the N-type first transistor and the capability of the N-type second transistor.

4. The noise filter circuit as defined in claim 1, the noise filter circuit comprising an inverter circuit that receives the input signal, the latch circuit receiving the input signal and a signal output from the inverter circuit as the set signal and the reset signal.

5. The noise filter circuit as defined in claim 1, each of the first logic circuit and the second logic circuit being configured so that the capability of the first transistor of either of the first conductivity type and the second conductivity type is lower than the capability of the second transistor of either of the first conductivity type and the second conductivity type.

6. The noise filter circuit as defined in claim 1, at least one pair of symmetrical transistors of the latch circuit having an identical capability.

7. The noise filter circuit as defined in claim 1, either of the first output level and the second output level rising gently and then rising steeply through a change point, the change point being higher than a value equal to half a power supply voltage of the latch circuit; and the other of the first output level and the second output level falling gently and then falling steeply through a change point, the change point being lower than a value equal to half the power supply voltage.

8. The noise filter circuit as defined in claim 1, the noise filter circuit comprising a waveform adjusting circuit that receives the output signal from the latch circuit, the noise filter circuit outputting a signal output from the waveform adjusting circuit as the output signal.

9. The noise filter circuit as defined in claim 8, the output signal from the latch circuit rising gently and then rising steeply through a change point, and a first input threshold value of the waveform adjusting circuit is set in a steep portion with respect to the change point; and the output signal from the latch circuit falling gently and then falling steeply through a change point, and a second input threshold value of the waveform adjusting circuit is set in a steep portion with respect to the change point.

10. A thermal head driver comprising the noise filter circuit as defined in claim 1.

11. A thermal head comprising the thermal head driver as defined in claim 10.

12. An electronic instrument comprising the noise filter circuit as defined in claim 1.

13. A printing system comprising a printer that includes the noise filter circuit as defined in claim 1.

* * * * *